US009009451B2

(12) United States Patent
Murray et al.

(10) Patent No.: US 9,009,451 B2
(45) Date of Patent: Apr. 14, 2015

(54) INSTRUCTION TYPE ISSUE THROTTLING UPON REACHING THRESHOLD BY ADJUSTING COUNTER INCREMENT AMOUNT FOR ISSUED CYCLE AND DECREMENT AMOUNT FOR NOT ISSUED CYCLE

(75) Inventors: Daniel C. Murray, Morgan Hill, CA (US); Andrew J. Beaumont-Smith, Cambridge, MA (US); John H. Mylius, Gilroy, CA (US); Peter J. Bannon, Concord, MA (US); Toshi Takayanagi, San Jose, CA (US); Jung Wook Cho, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 472 days.

(21) Appl. No.: 13/285,361

(22) Filed: Oct. 31, 2011

(65) Prior Publication Data

US 2013/0111191 A1    May 2, 2013

(51) Int. Cl.
*G06F 9/30* (2006.01)
*G06F 1/32* (2006.01)
(Continued)

(52) U.S. Cl.
CPC ............ *G06F 9/3836* (2013.01); *G06F 1/3206* (2013.01); *G06F 1/329* (2013.01); *G06F 11/30* (2013.01); *G06F 9/3838* (2013.01); *G06F 9/384* (2013.01); *G06F 9/3869* (2013.01); *G06F 11/3024* (2013.01); *G06F 11/3062* (2013.01);
(Continued)

(58) Field of Classification Search
CPC ....... G06F 1/3203; G06F 1/3234; G06F 1/32; G06F 1/3206
See application file for complete search history.

(56) References Cited

U.S. PATENT DOCUMENTS 5,996,083 A    11/1999    Gupta et al.
6,173,408 B1    1/2001    Jimbo et al.
(Continued)

FOREIGN PATENT DOCUMENTS

CN    1157641 C    7/2004
EP    0 651 314 A1    5/1995
(Continued)

OTHER PUBLICATIONS

Extended Search Report in EP Application No. 12185178.6-1957, Mar. 4, 2013, pp. 1-5.
(Continued)

*Primary Examiner* — Kenneth Kim
(74) *Attorney, Agent, or Firm* — Rory D. Rankin; Meyertons, Hood, Kivlin, Kowert & Goetzel, P.C.

(57) ABSTRACT

A system and method for reducing power consumption through issue throttling of selected problematic instructions. A power throttle unit within a processor maintains instruction issue counts for associated instruction types. The instruction types may be a subset of supported instruction types executed by an execution core within the processor. The instruction types may be chosen based on high power consumption estimates for processing instructions of these types. The power throttle unit may determine a given instruction issue count exceeds a given threshold. In response, the power throttle unit may select given instruction types to limit a respective issue rate. The power throttle unit may choose an issue rate for each one of the selected given instruction types and limit an associated issue rate to a chosen issue rate. The selection of given instruction types and associated issue rate limits is programmable.

21 Claims, 9 Drawing Sheets

(51) Int. Cl.
*G06F 9/38* (2006.01)
*G06F 11/30* (2006.01)

(52) U.S. Cl.
CPC ..... *H01L 2924/0002* (2013.01); *G06F 2201/81* (2013.01); *G06F 2201/88* (2013.01)

(56) References Cited

U.S. PATENT DOCUMENTS

| | | | |
|---|---|---|---|
| 6,651,176 | B1 | 11/2003 | Soltis, Jr. et al. |
| 6,775,787 | B2 * | 8/2004 | Greene ............... 713/340 |
| 6,826,704 | B1 | 11/2004 | Pickett |
| 7,246,219 | B2 | 7/2007 | Samra et al. |
| 7,793,125 | B2 | 9/2010 | Berry, Jr. et al. |
| 7,992,017 | B2 | 8/2011 | Safford et al. |
| 2005/0198538 | A1 | 9/2005 | Soltis, Jr. et al. |
| 2006/0279891 | A1 | 12/2006 | Dieffenderfer et al. |
| 2009/0019264 | A1 | 1/2009 | Correale, Jr. et al. |
| 2009/0019265 | A1 | 1/2009 | Correale, Jr. et al. |
| 2009/0132835 | A1 | 5/2009 | Ehmann |
| 2009/0182986 | A1 | 7/2009 | Schwinn et al. |
| 2009/0300329 | A1 | 12/2009 | Naffziger et al. |

FOREIGN PATENT DOCUMENTS

| | | |
|---|---|---|
| JP | 2005527010 A | 9/2005 |
| KR | 1020020062986 | 7/2002 |
| KR | 1020090077952 | 7/2009 |
| WO | 01/48584 | 7/2001 |
| WO | 2006/014254 | 2/2006 |
| WO | 2006/135554 | 12/2006 |
| WO | 2011074059 A1 | 6/2011 |

OTHER PUBLICATIONS

International Search Report and Written Opinion in application No. PCT/US2012/056831 mailed Sep. 24 2012.
Final Office Action in Japanese Patent Application No. 2012-230295, mailed Oct. 6, 2014, 8 pages.
Notice of Allowance in Korean Patent Application No. 10-2012-109532, mailed Jun. 27, 2014, 2 pages.
Office Action from Japanese Application No. 2012-230295, mailed Feb. 5, 2014, 10 pages.
Office Action in Chinese Application No. 201210366891.3, mailed Nov. 19, 2014, 29 pages.
Office Action in Taiwan Patent Application No. 101135164, mailed Nov. 26, 2014, 14 pages.

* cited by examiner

Throttle Table 500

| Power Throttle Code (binary code) | Floating-Point SIMD Latencies of Selected Instructions (clock cycles) | Count Threshold (Number of X instructions issued in last Y clock cycles) | Issue Rate Limit (Issued clock cycles (CCs) / total CCs) |
|---|---|---|---|
| 000 | 8, 12 | 128 | 66% |
| 001 | 6, 8, 12 | 128 | 66% |
| 010 | 2, 4, 6, 8, 12 | 128 | 66% |
| 100 | 8, 12 | 128 | 50% |
| 101 | 6, 8, 12 | 128 | 50% |
| 110 | 2, 4, 6, 8, 12 | 128 | 50% |
| 011, 111 | None | None | 100% |

INSTRUCTION TYPE ISSUE THROTTLING UPON REACHING THRESHOLD BY ADJUSTING COUNTER INCREMENT AMOUNT FOR ISSUED CYCLE AND DECREMENT AMOUNT FOR NOT ISSUED CYCLE

BACKGROUND OF THE INVENTION

1. Field of the Invention

This invention relates to computing systems, and more particularly, to efficiently reducing power consumption through issue throttling of selected problematic instructions.

2. Description of the Relevant Art

Geometric dimensions of devices and metal routes on each generation of semiconductor processor cores are decreasing. Therefore, more functionality is provided within a given area of on-die real estate. As a result, mobile devices, such as laptop computers, tablet computers, smart phones, video cameras, and the like, have increasing popularity. Typically, these mobile devices receive electrical power from one or more battery cells. Since batteries have a limited capacity, they are periodically connected to an external charger to be recharged. A vital issue for these mobile devices is power consumption. As power consumption increases, battery life for these devices is reduced and the frequency of recharging increases.

As the density of integrated circuits on a die increases with multiple pipelines, larger caches, and more complex logic, the number of nodes and buses that may switch per clock cycle significantly increases. Therefore, power consumption increases. Additionally, a software application may execute particular computer program code that causes the hardware to reach a high power dissipation value. Such code could do this either unintentionally or intentionally (e.g., a power virus). The power dissipation may climb due to multiple occurrences of given instruction types within the program code. This power dissipation value may reach or exceed the thermal design power (TDP) of the chip or even the maximum chip power dissipation.

In addition to the above, a mobile device's cooling system may be designed for a given thermal design power (TDP), or a thermal design point. The cooling system may be able to dissipate a TDP value without exceeding a maximum junction temperature for the semiconductor die. However, multiple occurrences of given instruction types may cause the power dissipation to exceed the TDP for the semiconductor chip. Further, there are current limits for the power supply that may be exceeded as well. If power modes do not change the operating mode of the chip or turn off particular blocks within the chip, then the battery may be quickly discharged. In addition, physical damage may occur. While one approach to managing peak power dissipation may be to simply limit instruction issue so that it doesn't exceed a particular threshold, this may result in an unacceptable reduction in overall performance.

In view of the above, efficient methods and mechanisms for reducing power consumption through issue throttling of selected instructions are desired.

SUMMARY OF EMBODIMENTS OF THE INVENTION

Systems and methods for reducing power consumption through issue throttling of selected instructions are contemplated.

In one embodiment, a processor includes a power throttle unit. The power throttle unit may be used within a same pipeline stage as a scheduler. The power throttle unit maintains one or more instruction issue counts for one or more instruction types. The instruction types may be a subset of supported instruction types executed by an execution core within the processor. The instruction types may be chosen based on high power consumption estimates for processing instructions of these types. For example, a floating-point (FP) single-instruction-multiple-data (SIMD) instruction type may have wide data lanes for processing vector elements during a multi-cycle latency. While maintaining the instruction issue counts, the power throttle unit may determine a given instruction issue count exceeds a given threshold. In response, the power throttle unit may select one or more instruction types to limit a respective issue rate.

The selection of one or more instruction types may be based on a power state estimation. Alternatively, this selection may be based on a user's changes made via software. The power throttle unit may choose an issue rate for each one of the selected one or more candidate instruction types. This choosing of an issue rate may also be based on a power state estimation or software updates of particular control registers. The power throttle unit may limit an associated issue rate for each one of the selected one or more instruction types to a respective chosen issue rate. Therefore, the issue rate limit may change, or is programmable.

These and other embodiments will be further appreciated upon reference to the following description and drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Figure 1:
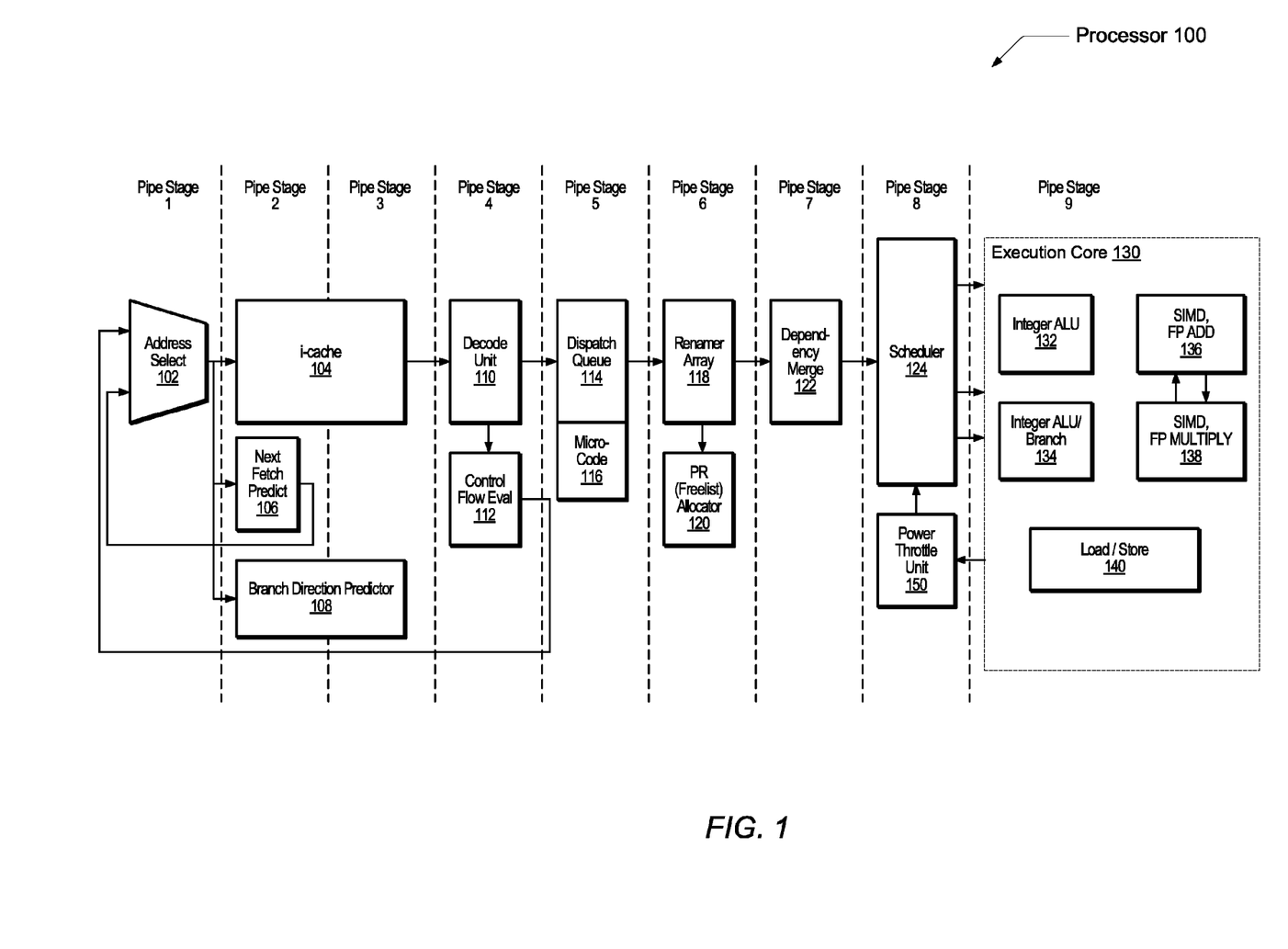
FIG. 1 is a generalized block diagram of one embodiment of a processor core that performs out-of-order execution.

Referring to FIG. 1, a generalized block diagram illustrating one embodiment of a processor core 100 that performs out-of-order execution is shown. The processor 100 may utilize a multi-stage pipeline for processing of instructions. An instruction-cache (i-cache) 104 may store instructions for a software application. One or more instructions indicated by an address conveyed by the address select logic 102 may be fetched from the i-cache 104. Multiple instructions may be fetched from the i-cache 104 per clock cycle if there are no i-cache misses. The address may be incremented by the next fetch predictor 106. A branch direction predictor 108 may be coupled to each of the next fetch predictor 106 and the control flow evaluation logic 110 in a later pipeline stage. The predictor 106 may predict information of instructions that change the flow of an instruction stream from executing a next sequential instruction.

The decode unit 110 decodes the opcodes of the multiple fetched instructions. Alternatively, the instructions may be divided into micro-instructions, or micro-ops. As used herein, the terms "instructions" and "micro-ops" are interchangeable as the invention may be used with an architecture that utilizes either implementation. The decode unit 110 may allocate entries in a dispatch queue 114. In one embodiment, the control flow evaluation block 112 may alter fetch of instructions in the address selector 102. For example, an absolute address value associated with an unconditional branch opcode may be sent to the address selector 102. The instructions in the dispatch queue 114 have associated operands and destination identifiers renamed by the renamer array 118. The renamer array 118 may receive candidate names from a freelist allocator 120.

A dependency merge block 122 may generate dependency vectors for received instructions. Renamed identifiers selected in the earlier pipeline stage may be used to find and indicate dependencies between instructions. The dependency merge block 122 may provide the instructions and associated renamed identifiers, program counter (PC) values, dependency vectors, and so forth to the scheduler 124.

The scheduler 124 may schedule instructions for execution in the execution core 130. When operands are available and hardware resources are also available, an instruction may be issued out-of-order from the scheduler 124 to one of the functional units within the execution core 130. The scheduler 124 may read its source operands from an architectural register file (not shown) or from operand bypass logic. The source operands may be provided to the execution core 130.

The execution core 130 may detect various events during the execution of instructions that may be reported to the scheduler 124. Two examples include mispredicted branch instructions and replayed load/store instructions. Various exceptions may be detected. Two examples include protection exceptions for memory accesses or for privileged instructions being executed in non-privileged mode and exceptions for no address translation. The exceptions may cause a corresponding exception handling routine to be executed, such as by the microcode 116.

The execution core may include a load/store unit 140. The load/store unit 140 may include a store buffer for storing addresses corresponding to store instructions, a store queue for storing store data corresponding to store instructions and a load buffer for storing both addresses and data for load instructions. The load/store unit 140 may be connected to a data cache (not shown). The processor 100 may include a translation look-aside buffer (TLB) for each of the i-cache 104 and the data cache to avoid a cost of performing a full memory translation when performing a cache access.

The execution core 130 may include several computation units that perform at least addition, subtraction, shifting, bitwise logic operations, rotation, and/or other functions. In the example shown, the execution core 130 includes an integer arithmetic logic unit (ALU) 132, a combination of an integer ALU and branch resolve logic 134, a floating-point unit 136 with both floating-point addition and subtraction and single-instruction-multiple-data (SIMD) computational logic, and a floating-point unit 138 with both floating-point multiplication and SIMD computational logic.

The SIMD instructions may perform a same operation in multiple data lanes. The SIMD instructions may utilize a separate register file from an architectural register file used by other instructions in the instruction set architecture (ISA). The registers for the SIMD instructions may be used as vectors of elements of a same data type. The SIMD instructions may be used to support media acceleration, signal processing and graphics. The processor 100 may support both signed and unsigned single and double precision floating point operations. One or more of these SIMD instructions may have a multi-cycle latency.

Due to the heavy processing and long latency, the execution of particular instructions may draw appreciable amounts of current from the power supply. Accordingly, these identified instructions consume significant power. These high power instructions may be referred to as problematic instructions. The issue rate of these problematic instructions may be changed on a clock cycle basis in order to maintain a given level of power consumption on the chip. For example, the power throttle 150 may monitor an issue rate of problematic instructions. When a qualified condition occurs, the power throttle may limit the issue rate of problematic instructions to a programmable reduced rate.

Figure 2:
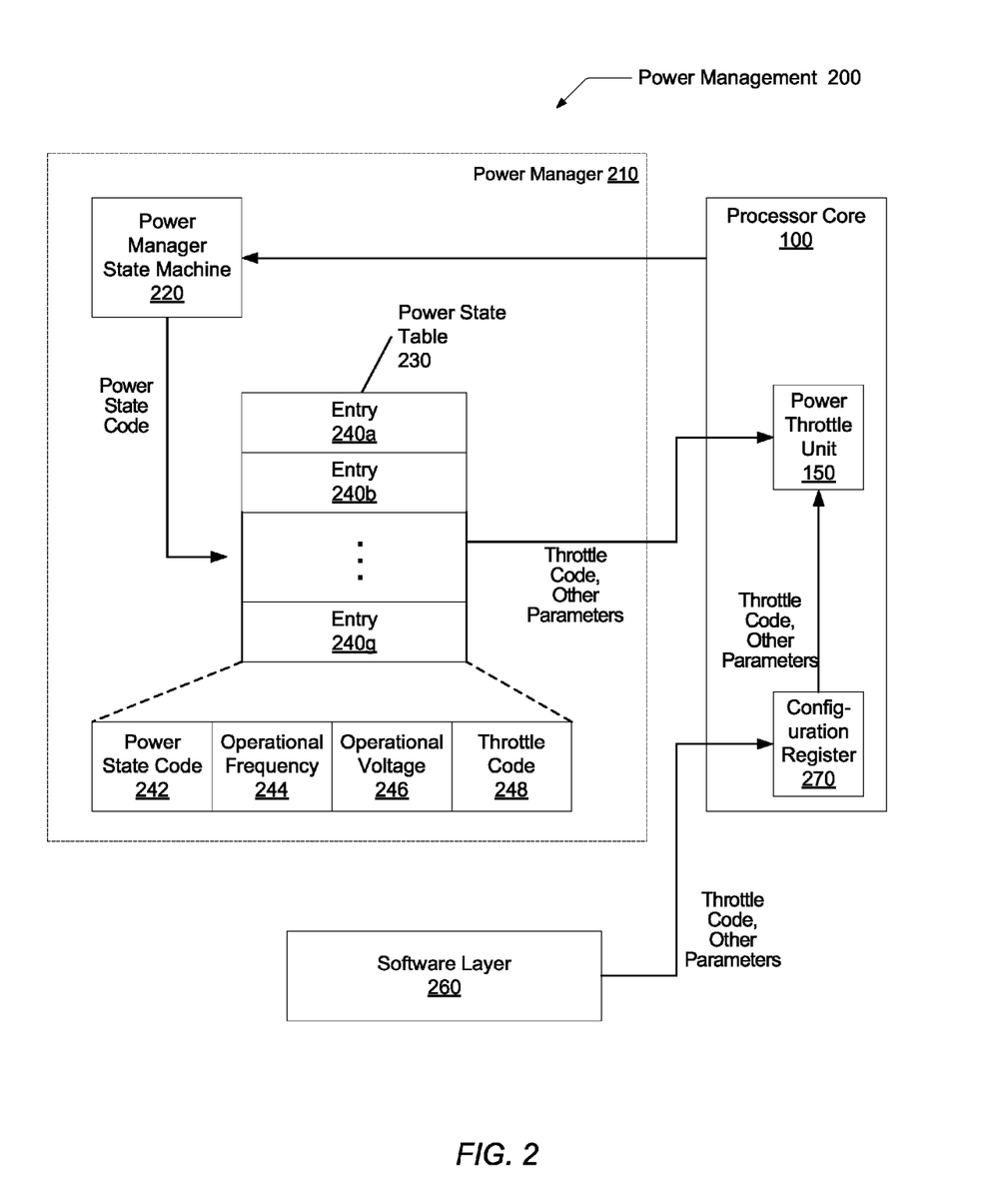
FIG. 2 is a generalized block diagram of one embodiment of power management for a semiconductor chip.

Referring now to FIG. 2, a generalized block diagram illustrating one embodiment of a power management system 200 for a semiconductor chip is shown. In various embodiment, processor 100 may be configured to limit the issue rate of particular instruction types using the power throttle unit 150. The power throttle unit 150 may be controlled by software or hardware. In one embodiment, a particular bit field within a chosen hardware configuration register 270 within the processor 100 may be updated with a throttle code by a software layer 260. The power throttle unit may use the throttle code to determine an instruction issue rate limit for particular instruction types. The software layer 260 may be a user program, a kernel in an operating system, or other software. In alternative embodiments, other parameter values, rather than a throttle code, may be used to set a limit of the instruction issue rate of particular instruction types. These other parameters are further described below. In yet other embodiments, a power manager 210 may adjust a throttle code or other parameters used by the power throttle unit 150 to set the limit of the instruction issue rate of particular instruction types.

Processor 100 may be any integrated circuit (IC). In various embodiments, processor 100 may include one or more cores each with an on-die instruction and data cache. The processor 100 may be a superscalar processor with a single pipeline or multiple pipelines. In another embodiment, processor 100 may be an application specific IC (ASIC). In yet another embodiment, the processor 100 may include one or more computational blocks on a system-on-a-chip (SOC). Any transistor family may be use to implement processor 100. Examples include metal oxide semiconductor field effect transistors (MOSFETs) and bipolar junction transistors (BJTs).

In one embodiment, the software layer 260 may update a hardware configuration register 270 within the processor 100 with a throttle code. In one embodiment, input/output (I/O) pins on the processor 100 may provide access to the hardware configuration register. Alternatively, particular instructions from a user software program or a kernel of an operating system may be executed by the hardware of the processor 100 and update the configuration register with a specified value. In one example, the configuration register 270 is a supervisor level exception handling register with a reserved miscellaneous bit field. A specified portion of the miscellaneous bit field may be used with care to store the throttle code. Other examples of user level and supervisor level configuration registers may also be used. Additionally, other values may be stored in the hardware configuration register 270. An example of another value may include an instruction issue rate limit. Other examples include an increment value and a decrement value, discussed below, used to maintain an instruction count and generate an instruction issue rate limit. Alternatively, hardware logic may be used to perform these steps as described below.

In one embodiment, the power manager state machine 220 may be used to collect data from the processor 100. While running an application or applications, an estimated real-time power consumption of the processor 100 may be conveyed to the power manager state machine 220. Any of a variety of techniques may be utilized to determine power consumption of the processor 100. In one embodiment, on-die current sensors may provide estimates of drawn currents to the power manager state table 230. In another embodiment, the data may include binary logic values or numerical weighted values of selected sampled control and data signals. After collecting the data, the power manager state machine 220 may estimate power consumption for the processor 100 and determine changes to operating parameters of the processor 100.

In various embodiments, a power target may be assigned to the processor 100. The power target may, for example, be a thermal design power value. The thermal design power (TDP), which may be also referred to as a thermal design point, represents a maximum amount of power a cooling system is able to effectively dissipate for the processor 100. If a high power application or virus is executed on the processor 100, the power manager state machine 220 may make adjustments to the operating voltage, the operational frequency, or both. Generally speaking, the power consumption is proportional to the operational frequency and the operational voltage of the processor 100. In response to receiving updated power estimate data from the processor 100, the power manager state machine 220 may select a power-performance state (P-state) from several possible P-states. The selected P-state may be between a maximum performance state and a minimum power state. The maximum performance state may correspond to a maximum operating frequency and the minimum power state may correspond to a minimum operating frequency. The intermediate discrete power-performance states (P-states) between these two states may include given scaled values for a combination of the operating frequency and the operational voltage.

The P-state selected by the power manager state machine 220 may be indicated by a given power state code. This power state code may be used to index the power state table 230. In one embodiment, the power state table 230 includes multiple entries 240a-240g each including multiple fields 242-248. The field 242 may include a power state code. The power state code sent from the power manager state machine may be compared to the value stored in field 242 in each of the entries 240a-240g. A given entry of the entries 240a-240g that has a matching power state code may be used to provide one or more values stored in the other fields 244-248 to the processor 100. The field 244 may store an operational frequency associated with a P-state indicated by the power state code stored in field 242. Similarly, the field 246 may store an operational voltage associated with a P-state indicated by the power state code stored in field 242.

The field 248 may store a power throttle code. The power throttle code may be associated with a particular subset of instruction types that are processed by the processor 100. The particular subset of instruction types may be referred to as candidate instruction types. The power throttle code may indicate an instruction issue limit for the candidate instruction types. In one example, a given power throttle code may indicate an instruction issue limit expressed as a percentage. This percentage may be defined as a maximum number of clock cycles an instruction of a candidate instruction type is allowed to be issued within a given number of clock cycles. For example, a percentage of 50% may indicate an instruction of a candidate instruction type may be issued for execution a maximum of 1 clock cycle per every 2 clock cycles. A percentage of 66% may indicate an instruction of a candidate instruction type may be issued for execution a maximum of 2 clock cycles per every 3 clock cycles. Other issue rate limit percentages are possible and contemplated as discussed below. As the P-states change during the execution of applications on the processor 100, the power throttle code may also change to either provide more performance or to lower power consumption.

A given group of candidate instruction types may include one or more instruction types that have been determined or estimated to consume appreciable power during execution. For example, single-instruction-multiple-data (SIMD) instructions typically have wide data lanes for the simultaneously processing of multiple vector elements. In addition, one or more SIMD instructions may have an appreciable latency. Instructions with latencies of 8 to 12 clock cycles or more for a significant number of data lanes may draw an appreciable amount of current from the power supply during instruction execution.

Some examples of identified high power consumption instruction types include SIMD floating-point (FP) multiply-add, SIMD FP multiply, SIMD FP add, SIMD FP square root, SIMD reciprocal square, SIMD add, and so forth. Other high power consumption instructions are possible and contemplated. A given group of candidate instruction types may include one or more of the identified instruction types. A given group of candidate instruction types may be larger than a second group and be associated with a stronger instruction issue rate limit when a given power throttle code associated with high reduction in power consumption is selected from the power state table 230.

Figure 3:
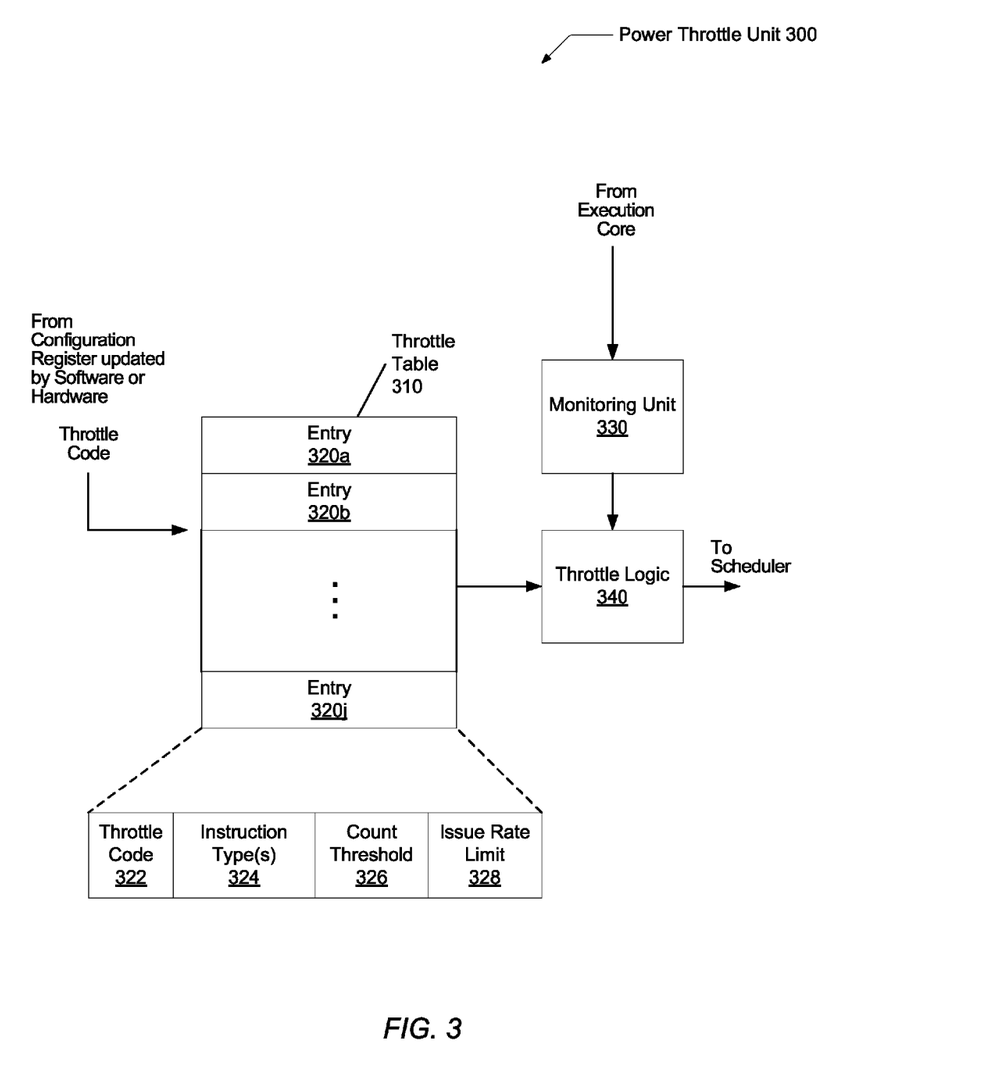
FIG. 3 is a generalized block diagram illustrating one embodiment of a power throttle unit.

Turning now to FIG. 3, a generalized block diagram illustrating one embodiment of a power throttle unit 300 is shown. In one embodiment, the power throttle unit 300 is located within the processor 100 and used within a same pipeline stage as the scheduler 124. The power throttle unit 300 may include a throttle table 310. In one embodiment, the throttle table 310 includes multiple entries 320a-320j each including multiple fields 322-328. The field 322 may store a power throttle code. The throttle table 310 may be indexed by a power throttle code value. In one embodiment, a power throttle code value may be stored in a configuration register, such as a status control register. This particular configuration register may be updated by software, such as a software application written by a designer, the operating system, or other. In another embodiment, a power throttle code may be sent from the power state table 230 as shown in FIG. 2. Other mechanisms for maintaining a power throttle code are possible and contemplated. A maintained power throttle code may be compared to the value stored in field 322 in each of the entries 320a-320g. A given entry of the entries 320a-320g that has a matching power throttle code may be used to provide values stored in the other fields 324-328 to the throttle logic 340.

The field 324 in the power throttle table 310 may store one or more identifiers of candidate instruction types associated with the power throttle code stored in field 322. The field 326 may store a threshold instruction issue count associated with both the candidate instruction types stored in field 324 and the power throttle code stored in field 322. The field 326 may alternatively store a threshold value for an instruction issue rate rather than for an instruction issue count. Other measurements corresponding to an amount of processing performed by the processor 100 for executing instructions of the identified candidate instruction types may be used. The threshold value stored in field 326 may be used by throttle logic 340 to determine when to limit an instruction rate for the identified candidate instruction types. The throttle logic 340 may limit this instruction rate to a limit value stored in field 328.

The monitoring unit 330 may maintain an instruction issue count for one or more candidate instruction types. This count value may be updated each clock cycle and depend on whether or not an instruction of a given candidate instruction type is issued to the execution core 130 within the processor 100. In one embodiment, an individual count may be maintained for each candidate instruction type. In another embodiment, a count may be maintained for a group of two or more candidate instruction types. A given candidate instruction type may be included in one or more groups of candidate instruction types.

In one embodiment, a counter for a given candidate instruction type may be incremented by one for each clock cycle that an instruction of the given candidate instruction type is issued to the execution core 130. This counter may be decremented by one for each clock cycle that an instruction of the given candidate instruction type is not issued to the execution core 130. As further described later, in such an embodiment, the issue rate limit is 50%. Generally, the issue rate limit may correspond to the ratio of the decrement value to the sum of the increment and the decrement values. In other embodiments, values other than one may be used for the increment and the decrement amounts to achieve different issue rate limits. Similarly, the increment value may be different from the decrement value. For example, an issue rate limit of 60% may be achieved by setting the increment value to 2 for each clock cycle that an instruction of the given candidate instruction type is issued to the execution core 130 and by setting the decrement value to 3 for each clock cycle that an instruction of the given candidate instruction type is not issued to the execution core 130. In various other embodiments, each of the increment and decrement values may be programmable. In one embodiment, when a value within this counter reaches or surpasses a value stored in field 326 of a selected entry of the entries 320a-320j of table 310, the throttle logic 340 may begin sending control signals to the scheduler 124 to block issue of instructions of the candidate instruction types identified by identifiers stored in field 324.

In one example, a SIMD FP Multiply-Add instruction type may be identified by the field 324 in a selected entry of the entries 320a-320j in table 310. A threshold count value of 128 may be stored in field 326. The monitoring unit 330 may have a counter that increments and decrements by one as described in the above description. When the monitoring unit 330 detects a count value of 128, the monitoring unit 330 may notify the throttle logic 340. The field 328 of the same selected entry in table 310 may store an issue rate limit of 50%. The throttle logic may send control signals to the scheduler 124 to block issue of any instructions of the SIMD FP Multiply-Add instruction type in the next clock cycle. The count value may be decremented to 127 as a result of the block. In a following clock cycle, since the count is below the threshold, the control signals may be changed by the throttle logic 340 to remove any blocking. An instruction of the SIMD FP Multiply-Add instruction type may be issued. The count may be incremented again to 128. Again, control signals are sent to the scheduler 124 to prevent issue of any instructions of this instruction type. Therefore, a maximum issue rate for the SIMD FP Multiply-Add is set at 50%.

In one embodiment, the increment and decrement amounts may be changed when the threshold value stored in field 326 is reached. Continuing with the above example, if the field 328 stored an issue rate limit of 66%, then the decrement amount may be changed to two. When instructions of the SIMD FP Multiple-Add instruction type are blocked by the throttle logic 340, the associated count value is decremented from 128 to 126, rather than 127. Therefore, for two clock cycles, instructions of this particular instruction type are permitted to be issued before being blocked again for one clock cycle. The maximum issue rate for the SIMD FP Multiply-Add is set at 66%. Other increment and decrement amounts may be chosen to satisfy other specified issue rate limits. For example, an issue rate limit of 33% may be reached by changing the increment amount to two and keeping the decrement amount at one.

In one embodiment, there may be multiple threshold values stored in field 326. In such an embodiment, selecting one or more candidate instruction types to limit a respective issue rate and choosing an issue rate for each one of the selected one or more candidate instruction types may be based further upon which instruction issue count exceeded a respective threshold stored in field 326.

Continuing with the above embodiment, two or more groups of candidate instruction types may be identified in field 324. Two or more threshold values may be stored in field 326 associated with the groups identified in field 324. Rather than limit an issue rate for each of the two or more groups of candidate instruction types, a given group of the two or more groups may be selected for limiting an respective issue rate based on its respective instruction issue count exceeded its threshold. Such an embodiment may limit a size of the power throttle code and provide more flexibility in defining the power throttle codes.

Figure 4:
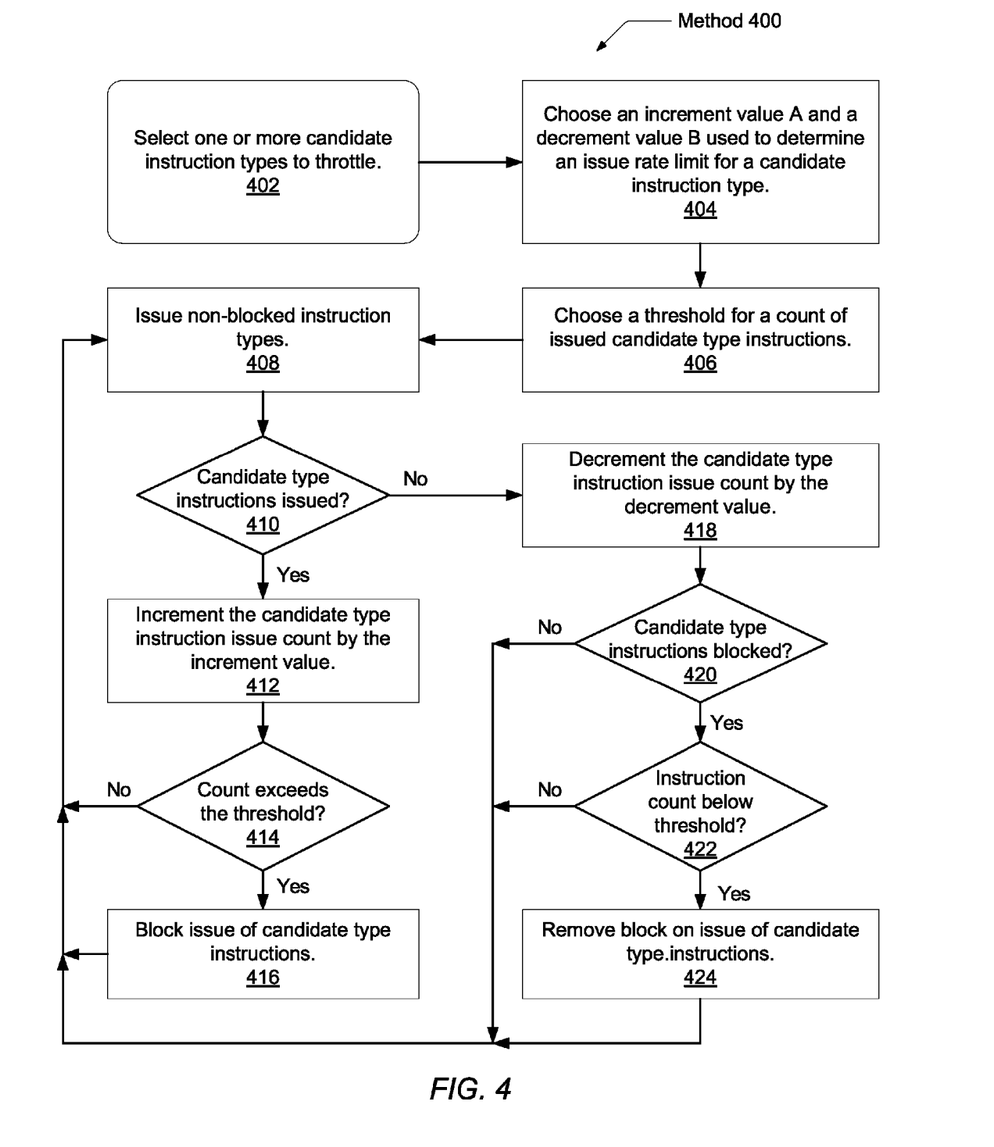
FIG. 4 is a generalized flow diagram illustrating one embodiment of a method for controlling an instruction issue rate of particular instruction types.

Turning now to FIG. 4, a generalized flow diagram of one embodiment of a method 400 for controlling an instruction issue rate of particular instruction types is shown. Method 400 may be modified by those skilled in the art in order to derive alternative embodiments. Also, the steps in this embodiment are shown in sequential order. However, some steps may occur in a different order than shown, some steps may be performed concurrently, some steps may be combined with other steps, and some steps may be absent in another embodiment.

In block 402, given instruction types may be selected as candidate instruction types to throttle. For example, instruction types associated with relatively high power consumption during execution may be selected for throttling. In various embodiment, floating-point SIMD instructions, load/store instructions, and others may be candidates.

In block 404, both an increment value, A, and a decrement value, B, may be chosen in order to determine an issue rate limit for the candidate instruction types. For example, in one embodiment the issue rate limit may corresponds to the ratio B/(A+B). Therefore, a given limit expressed as a percentage of cycles issuing candidate type instructions to a total number of cycles may be selected. For example, to set, or "dial", the power throttle unit and scheduler to a limit of 60%, an increment value of 2 and a decrement value of 3 may be chosen. These selected values yield a ratio equal to 3/(2+3), or 60%.

In one embodiment, the chosen values A and B may be selected by user software that updates a particular hardware configuration register. The power throttle unit may read this particular hardware configuration register. As described earlier, input/output (I/O) pins on the processor 100 may provide access to the hardware configuration register. Alternatively, particular instructions from a user software program or a kernel of an operating system may be executed by the hardware of the processor 100 and update with specified values particular bit fields of the configuration register. In yet other embodiments, hardware control logic may select the increment and the decrement values. In some embodiments, the hardware control logic may select these values based on at least a P-state value.

In block 406 of FIG. 4, a threshold may be selected for a count of issued candidate type instructions. This threshold may also be stored in a particular bit field in the hardware configuration register used for the selected increment and the decrement values. In block 408, instructions of types not currently blocked are issued from the scheduler to execution units. If any candidate type instructions are issued in this clock cycle (conditional block 410), then in block 412, the candidate type instruction issue count is incremented by the increment value. If this count value exceeds the selected threshold (conditional block 414), then in block 416 a block is set for issuing candidate type instructions corresponding to the threshold. Following this, control flow of method 400 returns to block 408. On the other hand, if no candidate type instructions are issued in this clock cycle (conditional block 410), then in block 418 the candidate type instruction issue count is decremented by the decrement value. In various embodiments the count may have a minimal value of zero.

If candidate type instructions are blocked (conditional block 420) and if this count value is below the selected threshold (conditional block 422), then in block 424 the block on issuing candidate type instructions may be removed or reset. Following this, control flow of method 400 returns to block 408. Due to removal of the block, candidate type instructions may be selected for issue. If candidate type instructions are not blocked (conditional block 420) or if the count value is above the selected threshold (conditional block 422), then control flow of method 400 returns to block 408.

The above description for blocks 404 and 406 describe individual selection of the increment, decrement, and threshold values. Alternatively, particular combinations of these values may be stored in a table. Selecting a particular combination by selecting a particular entry in this table may be performed with the software and the hardware mechanisms described earlier. One implementation of such a table is described below.

Figure 5:
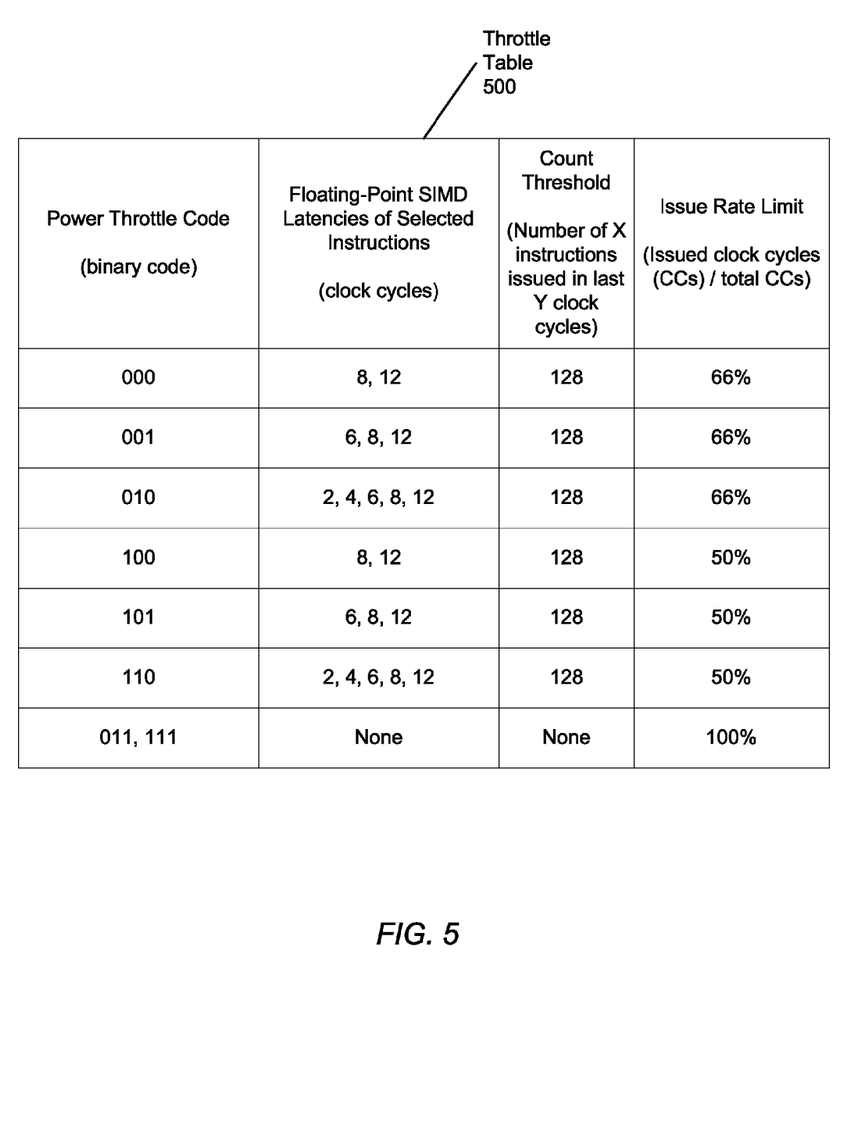
FIG. 5 is a generalized block diagram illustrating one embodiment of a throttle table.

Referring now to FIG. 5, a generalized block diagram of one embodiment of a throttle table 500 is shown. As shown, power throttle codes may be stored as binary values. Candidate instruction types may be grouped together based on estimated power consumption for execution of corresponding instructions. Latency may be used to distinguish between appreciable differences in power consumption. Here, SIMD FP instruction types are grouped by latency. For example, when a power throttle code of 'b000 is selected, only SIMD FP instruction types with latencies of 8 and 12 clock cycles are chosen for potential instruction issue throttling. When throttling begins, an issue rate limit of 66% may be used for the identified instruction types with latencies of 8 and 12 clock cycles.

In another embodiment, a threshold value used to determine when to begin instruction issue throttling may be an actual issue rate rather than an instruction issue count. For example, when the scheduler 124 has issued more than X instructions of the identified candidate instruction types within Y clock cycles, then the throttle logic 340 may block associated instructions every Z clock cycles. A moving window of the last Y clock cycles may be maintained that indicates for each of the Y clock cycles whether or not an associated instruction had been issued.

In one embodiment, a shift register with a size of Y bits, wherein Y is an integer, may be used to maintain the moving window of the last Y clock cycles. A count X may be incremented for each clock cycle an instruction of an associated candidate instruction type is issued to the execution core 130. Once Y clock cycles have passed, the count X may be also decremented when during a given clock cycle no instructions of the candidate instruction type is issued to the execution core, wherein the given clock cycle occurred Y clock cycles prior to a current clock cycle.

Referring again to the throttle table 310, each of the fields 324-328 for a given power throttle code may be programmable. These values may be altered from their initial values after program execution has begun. Similarly, each of the fields within table 500 for a given power throttle code may be programmable. A correlation between the power state code sent from the power manager state machine 220 and the power throttle code may be programmable too. Via software, a user may update particular control registers that store values corresponding to entries within table 310 or table 500.

Figure 6:
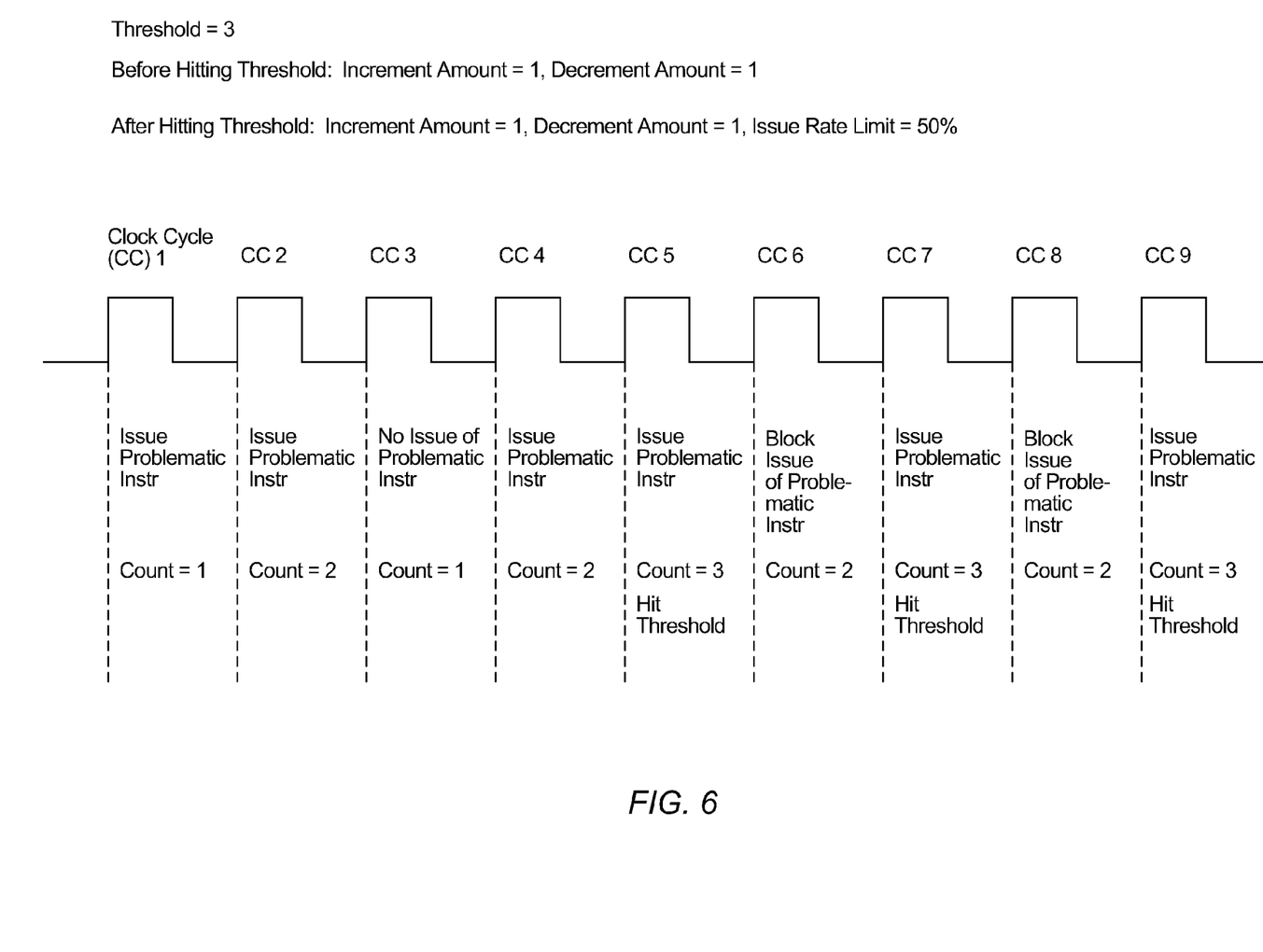
FIG. 6 is a generalized block diagram illustrating one embodiment of limiting an instruction issue rate.

Turning now to FIG. 6, a generalized block diagram of one embodiment of limiting an instruction issue rate is shown. As shown, in this example, a count threshold of 3 is used. Any count value may be selected. A count threshold of 3 is used for ease of illustration. Before hitting the threshold, each of an increment and a decrement amount has a value of one. An issue rate limit of 50% is selected. Therefore, in this example, the increment and the decrement amounts remain at one after the threshold is reached.

In clock cycle (CC) 1, a problematic instruction of identified candidate instruction types is issued to the execution core 130. Therefore, a count is incremented from 0 to 1. Similarly, in CC 2, a problematic instruction is issued and the count is incremented. At this time, the count is incremented to 2. In CC 3, no problematic instruction is selected for issue possibly due to no problematic instructions are available within the scheduler 124 or selection logic within the scheduler 124 selected other instructions for issue. Accordingly, the count is decremented from 2 to 1.

In each of CC 4 and CC 5, a problematic instruction is issued and the count is incremented. In CC 5, the count reaches the threshold value of 3. Therefore, the throttle logic 340 may send control signals to the scheduler 124 to block issue of any problematic instructions of the identified candidate instruction types. In CC 6, no problematic instructions are issued to the blocking and the count is decremented from 3 to 2. The blocking is removed since the count is below the threshold. In CC 7, a problematic instruction is issued and the count is incremented. In CC 7, the count again reaches the threshold value of 3. In CC 8 and CC 9, blocking and issue occurs as it occurred in CC 6 and CC 7. The issue rate for the problematic instructions has reached a maximum limit of one instruction issued per two clock cycles, or 50% of the time.

Figure 7:
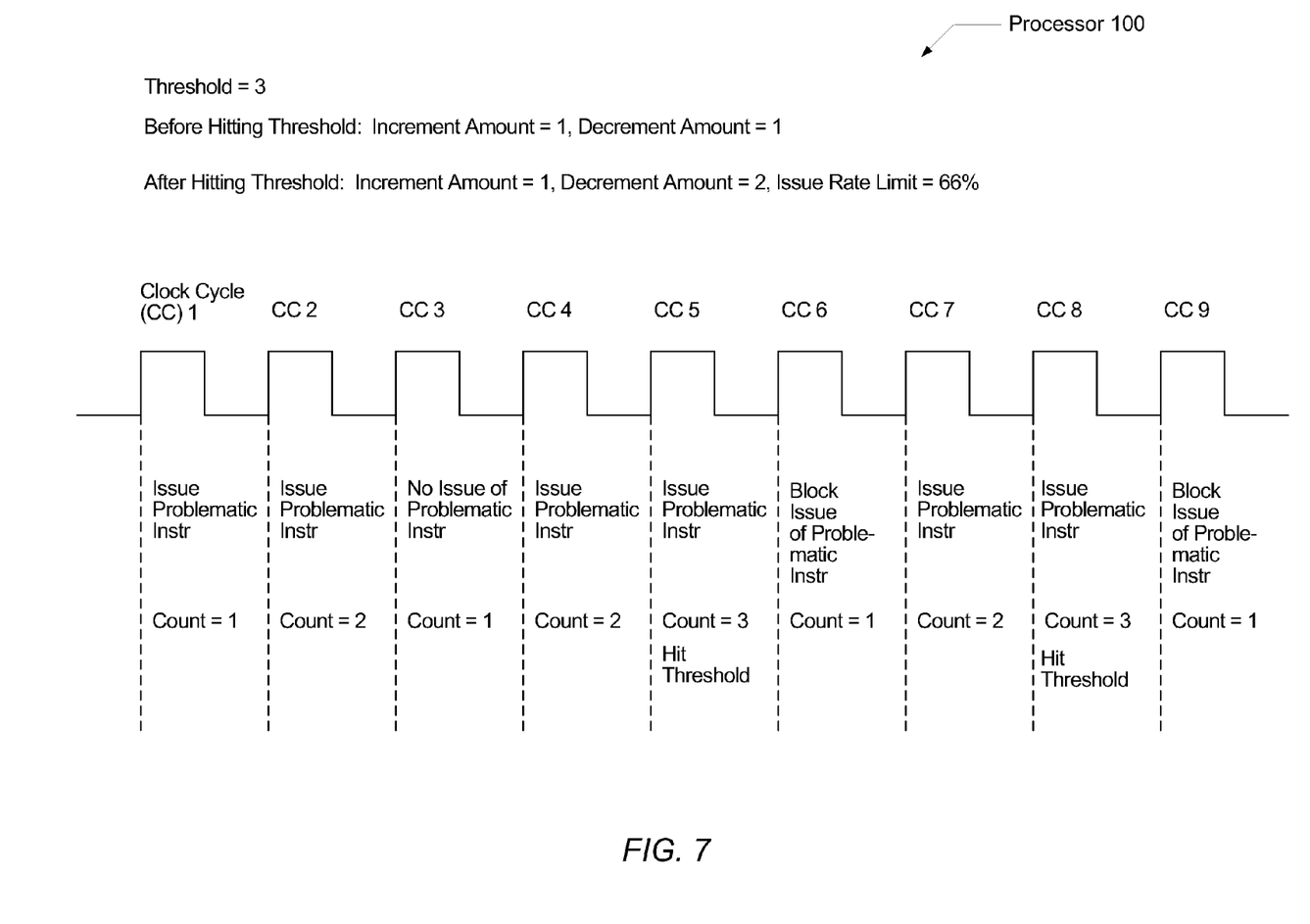
FIG. 7 is a generalized block diagram illustrating another embodiment of limiting an instruction issue rate.

Referring now to FIG. 7, a generalized block diagram of yet another embodiment of limiting an instruction issue rate is shown. As shown, in this example, a count threshold of 3 is again used. Before hitting the threshold, an increment amount is 1 and a decrement amount has a value of 1. An issue rate limit of 66% is selected. Therefore, in this example, the decrement amount changes to 2 after the threshold is reached.

In CC 1 to CC 4, problematic instructions are issued to the execution core 130 based on availability and selection logic within the scheduler 124. A count is maintained but the throttle logic does not block issue of the problematic instructions until the threshold value is reached in CC 5. Here, the count is decremented now by 2, rather than 1. In CC 6 to CC 8, problematic instructions are issued to the execution core 130 while the count is incremented by 1. In CC 8, the threshold is reached again. In CC 9, the problematic instructions are blocked for issue and the count is decremented now by 2, rather than 1. The issue rate for the problematic instructions has reached a maximum limit of two instructions issued per three clock cycles, or 66% of the time.

Figure 8:
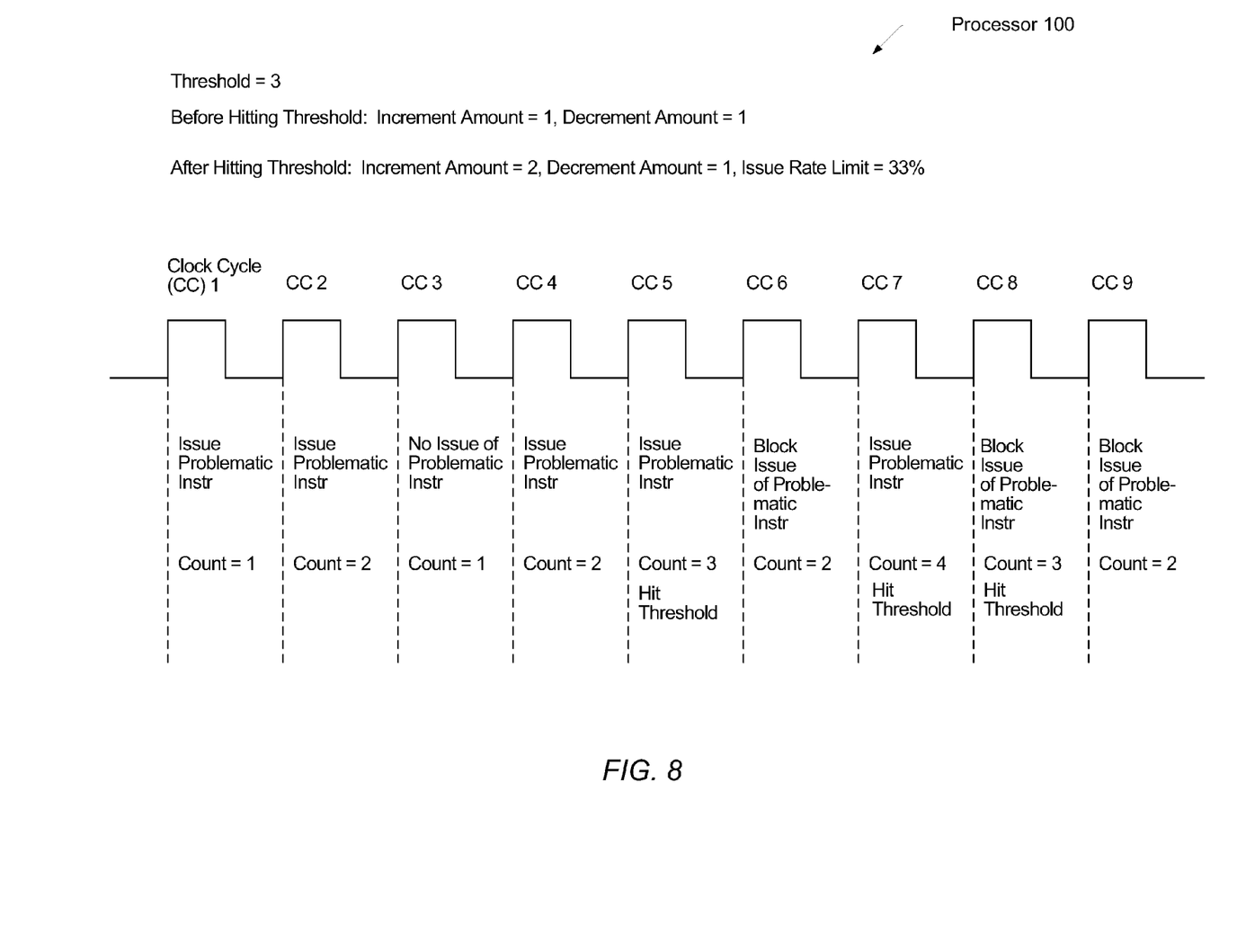
FIG. 8 is a generalized block diagram illustrating yet another embodiment of limiting an instruction issue rate.

Referring now to FIG. 8, a generalized block diagram of yet another embodiment of an example of issue rate limiting is shown. As shown, in this example, a count threshold of 3 is again used. Before hitting the threshold, an increment amount is 1 and a decrement amount has a value of 1. An issue rate limit of 33% is selected. Therefore, in this example, the increment amount changes to 2 after the threshold is reached.

In CC 1 to CC 4, problematic instructions are issued to the execution core 130 based on availability and selection logic within the scheduler 124. A count is maintained but the throttle logic does not block issue of the problematic instructions until the threshold value is reached in CC 5. Here, the count is still decremented by 1. In CC 7, a problematic instruction is issued to the execution core 130 since the count is below the threshold. However, the count is now incremented by 2, rather than 1. The count is changed from 2 to 4. The threshold is surpassed, so the throttle logic 340 sends control signals to the scheduler 124 to block issue of the problematic instructions. In CC 8, the threshold is still reached, so the problematic instructions are still blocked. The issue rate for the problematic instructions has reached a maximum limit of one instruction issued per three clock cycles, or 33% of the time.

Figure 9:
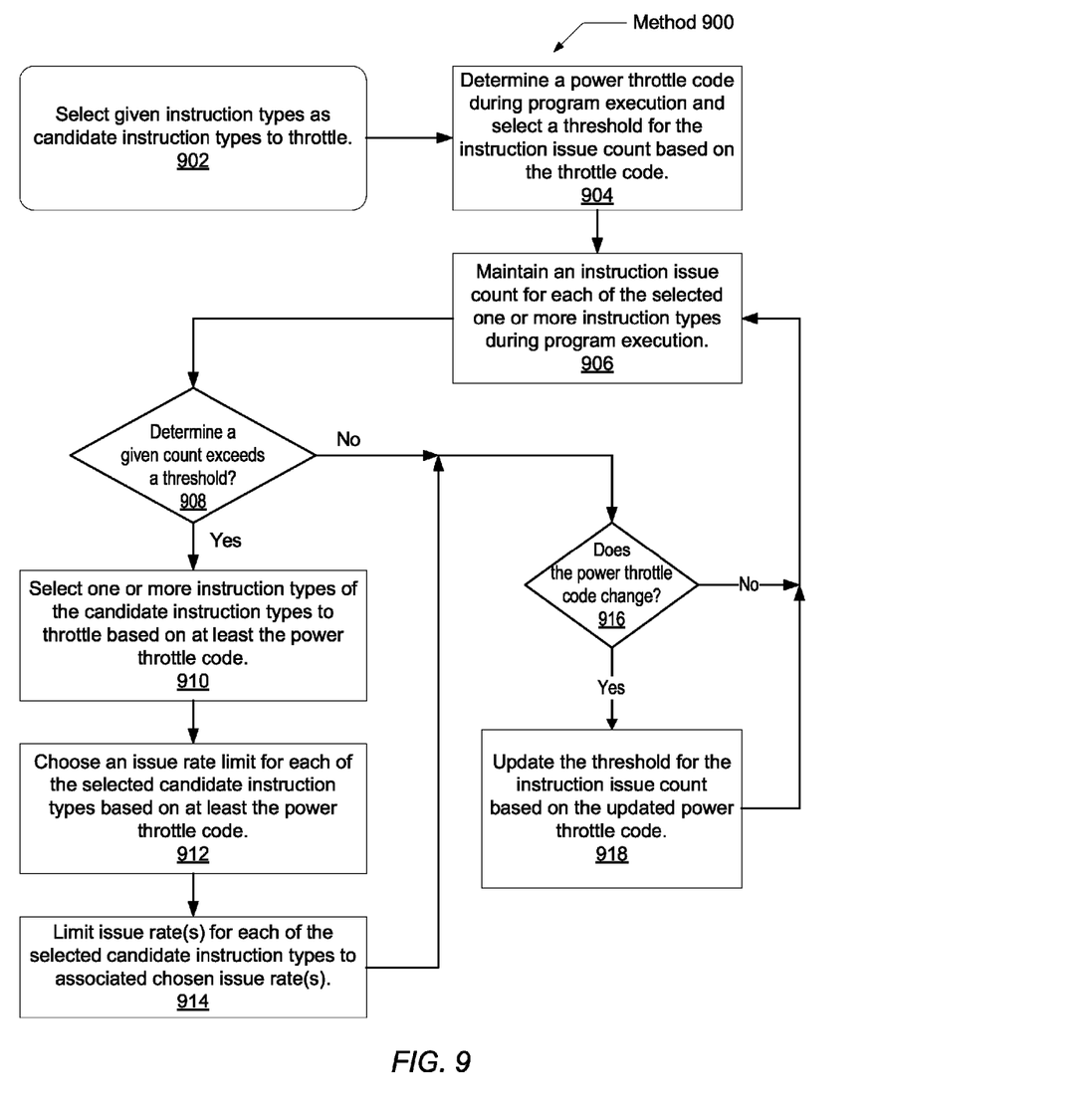
FIG. 9 is a generalized flow diagram of one embodiment of a method for controlling an instruction issue rate of particular instruction types.

Turning now to FIG. 9, a generalized flow diagram of one embodiment of a method 900 for controlling an instruction issue rate of particular instruction types is shown. Method 900 may be modified by those skilled in the art in order to derive alternative embodiments. Also, the steps in this embodiment are shown in sequential order. However, some steps may occur in a different order than shown, some steps may be performed concurrently, some steps may be combined with other steps, and some steps may be absent in another embodiment.

In the embodiment shown, given instruction types may be selected as candidate instruction types to throttle in block 902. Instruction types associated with high power consumption during execution may be selected. The associated high power consumption may be due to an appreciable amount of processing performed during a significant latency. Floating-point SIMD instructions, load/store instructions and others may be candidates. One or more groups of candidate instruction types may be selected.

In block 904, a power throttle code may be determined during execution of one or more software applications. In one embodiment, the power throttle code may be selected based on a power-performance state (P-state) estimated during execution of the one or more software applications. In another embodiment, the power throttle code may be read from a status control register written by a user via software. A given value for the power throttle code may be selected in order to select a given group of candidate instruction types and an issue rate limit. In one embodiment, a given threshold for an instruction issue count may be selected based on the power throttle code. In an alternative embodiment, a given threshold for an instruction issue rate, rather than the instruction issue count, may be selected based on the power throttle code.

In block 906, an instruction issue count for each of the selected groups of one or more instruction types is maintained during program execution. This count may be incremented and decremented by constant amounts determined prior to program execution. In an alternative embodiment, this count may be incremented and decremented by amounts read from a table such as a power throttle table 310. In yet another embodiment, an instruction issue rate may be maintained, rather than a count as described earlier.

If a maintained count or rate exceeds a given threshold (conditional block 908), then in block 910, one or more groups of one or more instruction types of the candidate instruction types are selected to possibly throttle. The amount of issue throttle may be based on at least the power throttle code. In block 912, an issue rate limit for the selected one or more groups is chosen based on at least the power throttle code. In block 914, the instruction issue rate(s) of the selected one or more groups is limited to an associated chosen issue rate(s). If the power throttle code does not change (conditional block 916), then the control flow of method 900 returns to block 906. Otherwise, in block 918, the threshold for the instruction issue count may be updated based on the changed power throttle code. In another embodiment, the threshold for the instruction issue rate may be updated based on the changed power throttle code. Control flow of method 900 then moves from block 918 to block 906.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A processor comprising:
a scheduler configured to select and issue instructions;
an execution core configured to receive and execute the issued instructions; and
a power throttle unit, wherein the power throttle unit is configured to:
maintain one or more instruction issue counts for one or more instruction types, wherein maintaining a given instruction issue count comprises:
incrementing the given instruction issue count by a first amount each clock cycle an instruction of a given instruction type is issued to the execution core; and
decrementing the given instruction issue count by a second amount each clock cycle an instruction of the given instruction type is not issued to the execution core; and
in response to determining a given instruction issue count of the one or more instruction counts exceeds a threshold:
select at least one instruction type of the one or more instruction types; and
choose a new issue rate for the at least one instruction type, wherein the new issue rate is different from a current issue rate and is effected by changing at least one of the first amount and the second amount.

2. The processor as recited in claim 1, wherein the power throttle unit is further configured to perform said selection and said choosing based on a power throttle code written by software.

3. The processor as recited in claim 1, wherein the power throttle unit is further configured to perform said selection and said choosing based on an operational power state of the processor.

4. The processor as recited in claim 1, further comprising a power state table comprising a plurality of entries, each of the entries associating a power state code with a throttle code.

5. The processor as recited in claim 3, wherein the power throttle unit is further configured to perform said selection and said choosing based further upon which instruction issue count exceeded a respective threshold.

6. The processor as recited in claim 1, further comprising a throttle table comprising a plurality of entries, each of the entries associating a throttle code with at least one of an instruction type, a count threshold, and an issue rate limit.

7. The processor as recited in claim 1, wherein the first amount and the second amount are not equal.

8. The processor as recited in claim 6, wherein the instruction types include single-instruction-multiple-data (SIMD) instructions.

9. A method comprising:
maintaining one or more instruction issue counts for one or more instruction types, wherein maintaining a given instruction issue count comprises:
incrementing the given instruction issue count by a first amount for each clock cycle an instruction of a given instruction type is issued to the execution core; and
decrementing the given instruction issue count by a second amount each clock cycle an instruction of the given instruction type is not issued to the execution core;
determining a given instruction issue count of the one or more instruction issue counts exceeds a given threshold;
in response to said determining:
selecting one or more instruction types; and
choosing a new issue rate for each one of the selected one or more instruction types, wherein the new issue rate is different from a current issue rate and is effected by changing at least one of the first amount and the second amount.

10. The method as recited in claim 9, further comprising performing said selection and said choosing based on a power throttle code written by software.

11. The method as recited in claim 9, further comprising performing said selection and said choosing based on an operational power state of a processor.

12. The method as recited in claim 9, further comprising maintaining a power state table comprising a plurality of entries, each of the entries associating a power state code with a throttle code.

13. The method as recited in claim 11, further comprising performing said selection and said choosing based further upon which instruction issue count exceeded a respective threshold.

14. The method as recited in claim 9, wherein said first amount and said second amount are chosen such that a particular issue rate for instructions of the given instruction type is achieved.

15. The method as recited in claim 9, wherein the first amount and the second amount are not equal.

16. The method as recited in claim 14, wherein the instruction types include single-instruction-multiple-data (SIMD) instructions.

17. A power throttle unit comprising:
a first interface to a scheduler configured to select and issue instructions;
a second interface to an execution core which is configured to receive and execute the issued instructions; and
throttle control logic, wherein the throttle control logic is configured to:
maintain one or more instruction issue rates for one or more instruction types based on detecting issued instructions via the second interface, wherein the instruction types are a subset of supported instruction types executed by the execution core, wherein maintaining a given instruction issue count comprises:
incrementing the given instruction issue count by a first amount for each clock cycle an instruction of a given instruction type is issued to the execution core; and
decrementing the given instruction issue count by a second amount each clock cycle an instruction of the given instruction type is not issued to the execution core;
determine a given instruction issue rate of the one or more instruction issue rates exceeds a given threshold;
in response to said determination:
select one or more instruction types; and
choose a new issue rate for each one of the selected one or more instruction types wherein the new issue rate is different from a current issue rate and is effected by changing at least one of the first amount and the second amount.

18. The power throttle unit as recited in claim 17, wherein the throttle control logic is further configured to perform said selection and said choosing based on a power throttle code written by software.

19. The power throttle unit as recited in claim 17, wherein the throttle control logic is further configured to perform said selection and said choosing based on an operational power state of the processor.

20. The power throttle unit as recited in claim 17, further comprising a power state table comprising a plurality of entries, each of the entries associating a power state code with a throttle code.

21. The power throttle unit as recited in claim 17, wherein the first amount and the second amount are not equal.

* * * * *